(12) United States Patent
Kao

(10) Patent No.: US 9,116,575 B2
(45) Date of Patent: Aug. 25, 2015

(54) CAPACITANCE SENSING CIRCUIT AND POWER SUPPLYING APPARATUS UTILIZING THE CAPACITANCE SENSING CIRCUIT

(71) Applicant: PixArt Imaging Inc., Hsin-Chu (TW)

(72) Inventor: Hong-Sing Kao, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 80 days.

(21) Appl. No.: 14/159,417

(22) Filed: Jan. 20, 2014

(65) Prior Publication Data

US 2014/0362037 A1     Dec. 11, 2014

(30) Foreign Application Priority Data

Jun. 11, 2013 (TW) .............................. 102120801 A

(51) Int. Cl.
*G06F 3/044* (2006.01)
*G06F 3/042* (2006.01)
*G01R 27/26* (2006.01)

(52) U.S. Cl.
CPC ............ *G06F 3/042* (2013.01); *G01R 27/2605* (2013.01); *G06F 3/044* (2013.01); *Y10T 307/696* (2015.04)

(58) Field of Classification Search
None
See application file for complete search history.

(56) References Cited

U.S. PATENT DOCUMENTS

| | | | |
|---|---|---|---|
| 2011/0186359 A1* | 8/2011 | Chen et al. | 178/18.06 |
| 2012/0146726 A1* | 6/2012 | Huang et al. | 330/257 |
| 2013/0038570 A1* | 2/2013 | Seo et al. | 345/174 |
| 2013/0113756 A1* | 5/2013 | Kim | 345/174 |

* cited by examiner

*Primary Examiner* — Tony N Ngo
(74) *Attorney, Agent, or Firm* — Winston Hsu; Scott Margo

(57) ABSTRACT

A capacitance sensing circuit, comprising: a first voltage source; a first switch, wherein the first voltage source charges a sensing capacitor to a first voltage when the first switch is conductive; a base capacitor; a second voltage source; a second switch, wherein the second voltage source charges the base capacitor to a second voltage when the second switch is conductive, where the first switch and the second switch are simultaneously conductive via a control signal; a first comparator, for outputting a first comparing result according to a voltage difference between a sensing voltage on the sensing capacitor and a base voltage on the base capacitor, and a voltage difference between the first voltage and the second voltage; and a voltage holding circuit, for keeping the base voltage at a reference voltage.

12 Claims, 4 Drawing Sheets

CAPACITANCE SENSING CIRCUIT AND POWER SUPPLYING APPARATUS UTILIZING THE CAPACITANCE SENSING CIRCUIT

BACKGROUND OF THE INVENTION

1. Field of the Invention

The present invention relates to a capacitance sensing circuit and a power providing apparatus, and particularly relates to a capacitance sensing circuit and a power providing apparatus utilizing a voltage holding circuit.

2. Description of the Prior Art

A recent electronic apparatus always comprises a touch control apparatus. For example, the major input mechanism for a smart phone is that a user can utilize an object such as a finger or a touch control pen to input a command. The touch control panel for a laptop is also another kind of a touch control apparatus. The touch control apparatus can be classified into various types, and a popular one there between is a capacitor type touch control apparatus. Such kind of touch control apparatus determines the touch control operation for the object depending on the variation of the capacitance value.

FIG. 1 is a circuit diagram for a prior art capacitance sensing circuit. As shown in FIG. 1, the voltage source Vu charges the sensing capacitor $C_S$, such that the voltage of the sensing terminal $T_S$ is kept at a predetermined voltage $V_P$. If the object approaches or touches an electronic apparatus which the capacitance sensing circuit is provided in, a capacitance value of the sensing capacitor $C_S$ increases such that the voltage of the sensing terminal $T_S$ is reduced to be smaller than the predetermined voltage $V_P$, and thereby the output for the comparator Com changes. By this way, it can be determined that if the object approaches or touches the electronic apparatus which the capacitance sensing circuit is provided in.

However, the sensing capacitor $C_S$ may have leakage current after it is charged to the predetermined voltage $V_P$, thus the voltage of the sensing terminal $T_S$ decreases. In such case, the comparator Com may wrongly determines the object approaches or touches even the object is far away, since the voltage of the sensing terminal $T_S$ decreases.

SUMMARY OF THE INVENTION

Therefore, one objective of the present invention is to provide a capacitance sensing circuit that can accurately sense capacitance variation.

Another objective of the present invention is to provide a power supplying apparatus utilizing above-mentioned capacitance sensing circuit.

Another objective of the present invention is to provide an optical touch control apparatus utilizing the power supplying apparatus.

One embodiment of the present invention discloses a capacitance sensing circuit, which comprises: a first voltage source; a first switch, wherein the first voltage source charges an sensing capacitor to a first voltage when the first switch is conductive; a base capacitor; a second voltage source; a second switch, wherein the second voltage source charges the base capacitor to a second voltage when the second switch is conductive; a first comparator, for outputting a first comparing result according a difference between a first voltage difference and a second voltage difference, wherein the first voltage difference is a difference for the first voltage and the second voltage, wherein the second voltage difference is a difference for an sensing voltage on the sensing capacitor and a base voltage on the base capacitor; and a voltage holding circuit, for keeping the base voltage at a reference voltage.

Another embodiment of the present invention discloses a power supplying apparatus, which comprises a power supplying unit, a control unit, a capacitance sensing circuit. The power supplying unit provides a first power in a low power mode, and for providing a second power higher than the first power in a high power mode. The capacitance sensing circuit comprises: a first voltage source; a first switch, wherein the first voltage source charges an sensing capacitor to a first voltage when the first switch is conductive; a base capacitor; a second voltage source; a second switch, wherein the second voltage source charges the base capacitor to a second voltage when the second switch is conductive, wherein the first switch and the second switch are controlled by a control signal to be conductive or non-conductive; a first comparator, for outputting a first comparing result according a difference between a first voltage difference and a second voltage difference, wherein the first voltage difference is a difference for the first voltage and the second voltage, wherein the second voltage difference is a difference for an sensing voltage on the sensing capacitor and a base voltage on the base capacitor; and a voltage holding circuit, for keeping the base voltage at a reference voltage. The control unit controls the power supplying unit to operate in the high power mode if the difference between the first voltage difference and the second voltage difference is larger than a voltage threshold value. The control unit controls the power supplying unit to operate in the low power mode if the difference between the first voltage difference and the second voltage difference is smaller than a voltage threshold value.

Another embodiment of the present invention discloses an optical touch control apparatus, which comprises: a sensing surface, a light source, an image sensor, a processing unit and a power supplying apparatus. The power supplying apparatus comprises above-mentioned devices, and provides power to at least one of the sensing surface, the light source, the image sensor, the processing unit and the power supplying apparatus in different modes.

In view of above-mentioned embodiment, the variation for the capacitance value of the sensing capacitor can be accurately determined regarding the disturbance due to the capacitor leakage current. By this way, the touching or approaching for the object can be accurately computed to increase the efficiency for the power providing apparatus.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
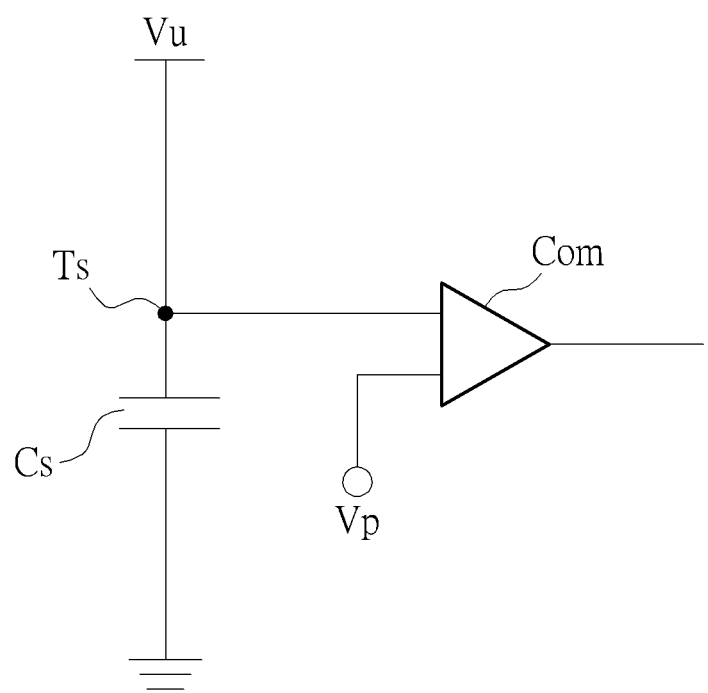
FIG. 1 is a circuit diagram for a prior art capacitance sensing circuit.
Figure 2:
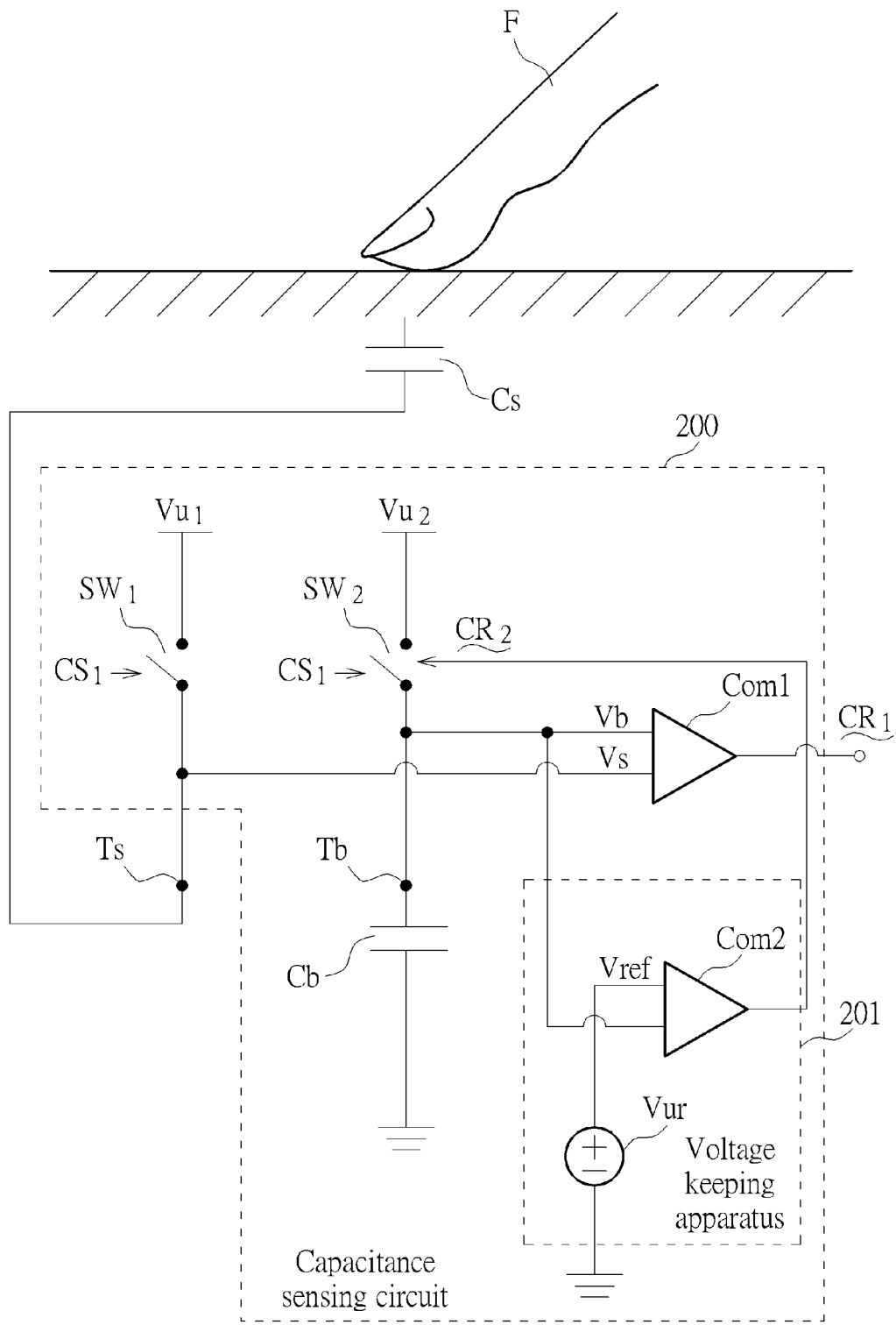
FIG. 2 is a circuit diagram for a capacitance sensing circuit according to an embodiment of the present invention.

FIG. 2 is a circuit diagram for a capacitance sensing circuit 200 according to an embodiment of the present invention. As shown in FIG. 2, the capacitance sensing circuit 200 comprises voltage sources $V_{u1}$, $V_{u2}$, switches $SW_1$, $SW_2$, a base capacitor $C_b$, a comparator $Com_1$, and a voltage keeping apparatus 201. The voltage source $V_{u1}$ charges a sensing capacitor $C_S$ such that a sensing voltage $V_s$ of a sensing terminal $T_s$ becomes a first voltage $V_1$ when the switch $SW_1$ is controlled by a control signal $CS_1$ to be conductive. The voltage source $V_{u2}$ charges a base capacitor $C_b$ such that a base voltage $V_b$ of a base terminal $T_b$ becomes a second voltage $V_2$ when the switch $SW_2$ is controlled by a control signal $CS_1$ to be conductive. The switches $SW_1$, $SW_2$ are controlled by the control signal $CS_1$ to be simultaneously conductive. After the sensing voltage $V_s$ and the base voltage $V_b$ are respectively charged to the first voltage $V_1$ and the second voltage $V_2$, the switch $SW_1$, $SW_2$ are controlled by the control signal $CS_1$ to be simultaneously non-conductive. The comparator $Com_1$ outputs a comparing result $CR_1$ according a difference between a first voltage difference and a second voltage difference. The first voltage difference is a difference for the first voltage $V_1$ and the second voltage $V_2$, and the second voltage difference is a difference for the sensing voltage $V_s$ and the base voltage $V_b$. Therefore, the capacitance for sensing capacitor Cs increases when the object touches or approaches the electronic apparatus comprising the capacitance sensing circuit 200, such that the sensing voltage $V_s$ decreases to cause variation for the difference between the above-mentioned first voltage difference and the second voltage difference. By this way, the output for the comparator $Com_1$ changes.

That is, if an object approaches or touches the electronic apparatus comprising the capacitance sensing circuit 200, the comparing result $CR_1$ from the comparator $Com_1$ changes to indicate the object approaches or touches the electronic apparatus. If a difference for the above-mentioned first voltage difference and the above-mentioned second voltage difference is smaller than a voltage threshold value, the comparator $Com_1$ outputs the comparing result $CR_1$ indicating the object does not touch or approach. Oppositely, if a difference for the above-mentioned first voltage difference and the above-mentioned second voltage difference is larger than a voltage threshold value, the comparator $Com_1$ outputs the comparing result $CR_1$ indicating the object touches or approaches. In one embodiment, the voltage difference for the first voltage $V_1$ and the second voltage $V_2$ is 0 (i.e. the first voltage difference is zero), such that the comparator $Com_1$ outputs the comparing result $CR_1$ indicating the object touches or approaches once the sensing voltage $V_s$ and the base voltage $V_b$ are different (i.e. the second voltage different is not 0). However, in another example the first voltage difference is not zero (ex. 0.5V), therefore if the second voltage difference is different from 0.5V more than a voltage threshold value, the comparator $Com_1$ outputs the comparing result $CR_1$ indicating the object touches or approaches. Therefore, the standards for the comparator $Com_1$ can be set for different situations.

The base capacitor $C_b$ is used to keep the difference for the first voltage difference and the second voltage difference to be the same when the object does not touch or approach the electronic apparatus comprising the capacitance sensing circuit 200. That is, if the sensing voltage $V_s$ and the base voltage $V_b$ are respectively charged to the first voltage $V_1$ and the second voltage $V_2$, but the sensing capacitor $C_s$ has leakage current, the base capacitor $C_b$ correspondingly has leakage current such that the sensing voltage $V_s$ and the base voltage $V_b$ simultaneously drop. By this way, the difference for the first voltage difference and the second voltage difference can be kept the same.

However, if the base capacitor $C_b$ and the sensing capacitor $C_s$ have different amount of leakage currents (i.e. the voltage drop due thereof are different), the determination for the comparator $Com_1$ may be affected. For example, if the amount of the leakage current of the base capacitor $C_b$ is larger than which of the sensing capacitor $C_s$, the first voltage difference and the second voltage difference become different due to the different leakage currents even the object does not touch or approach the electronic apparatus comprising the capacitance sensing circuit. In such case, the comparator $Com_1$ still outputs the comparing result $CR_1$ indicating the object touches or approaches even the object does not touch or approach the electronic apparatus. The voltage holding circuit 201 keeps the base voltage $V_b$ at a reference voltage $V_{ref}$ such that the wrong determination for the comparator $Com_1$ can be avoided even if the base capacitor $C_b$ and the sensing capacitor $C_s$ have different amount of leakage currents. The value for the reference voltage $V_{ref}$ can be determined according to at least one parameter: the leakage current for the sensing capacitor $C_s$, the leakage current for the base capacitor $C_b$ and the above-mentioned voltage threshold value. By this way, the accuracy for the determination of the comparator $Com_1$ is increased rather than decreased when keep the base voltage $V_b$ at the reference voltage $V_{ref}$. In one embodiment, the voltage holding circuit 201 comprises a comparator $Com_2$ for comparing the base voltage $V_b$ and the reference voltage $V_{ref}$, which is provided by a reference voltage source $V_{ur}$, to output a comparing result $CR_2$ for controlling the switch $SW_2$. By this way, the base voltage $V_b$ can be kept at the reference voltage $V_{ref}$.

Figure 3:
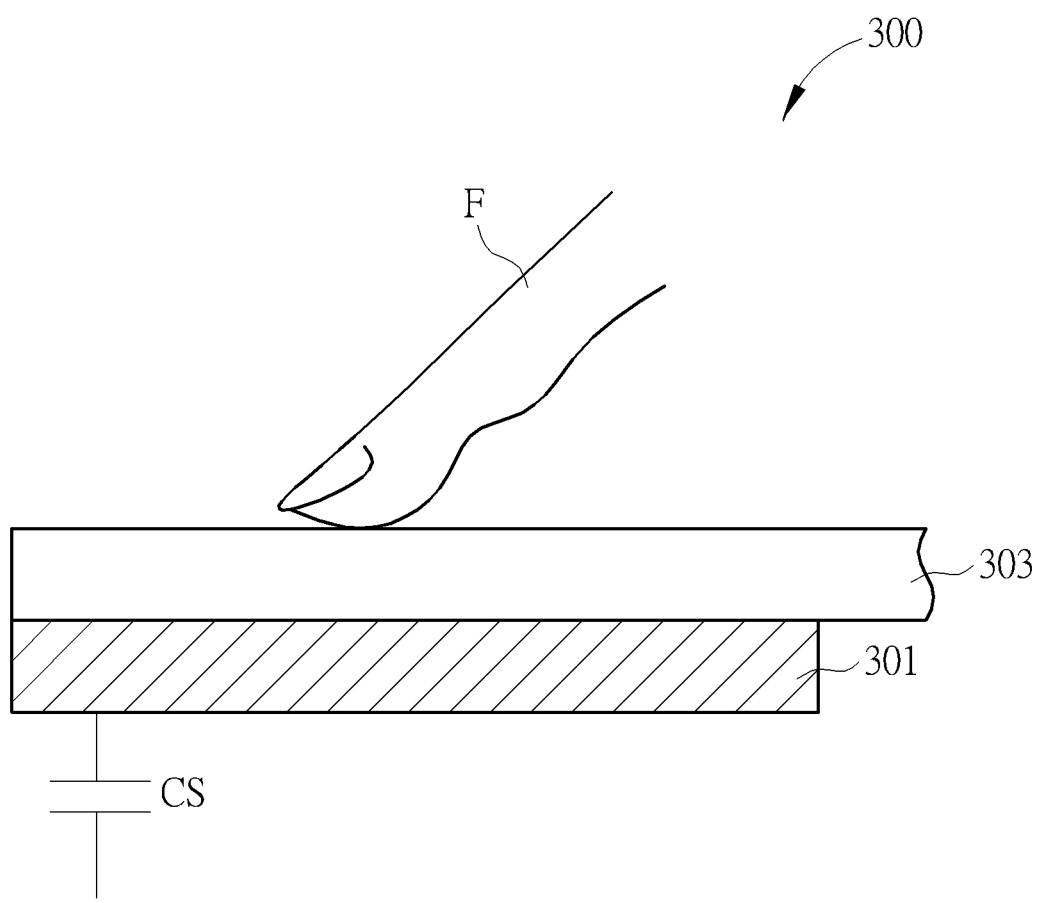
FIG. 3 is a schematic illustrating an example for how the sensing capacitor in FIG. 2 is formed.

FIG. 3 is a schematic illustrating an example for how the sensing capacitor in FIG. 2 is formed. As shown in FIG. 3, the electronic apparatus 300 comprises a conductive plate 301 (ex. a metal plate) and a media layer 303 (ex. a case for an electronic apparatus, or a sensing surface). The conductive layer 301 is coupled to the voltage source $V_{u1}$ in FIG. 2 to form the sensing capacitor CS in FIG. 2. The medium layer 303 covers the conductive plate 301, the conductive plate 301 and the object form the sensing capacitor if a distance between the object (ex. a finger F) and the medium layer 303 is smaller than a predetermined value, such that the capacitance value of the sensing capacitor becomes large. Please note the structure in FIG. 3 is only for example, if a capacitor is formed by the devices in the electronic apparatus and the capacitance thereof changes when an object touches or approaches, such capacitor should fall in the scope of the present application.

Figure 4:
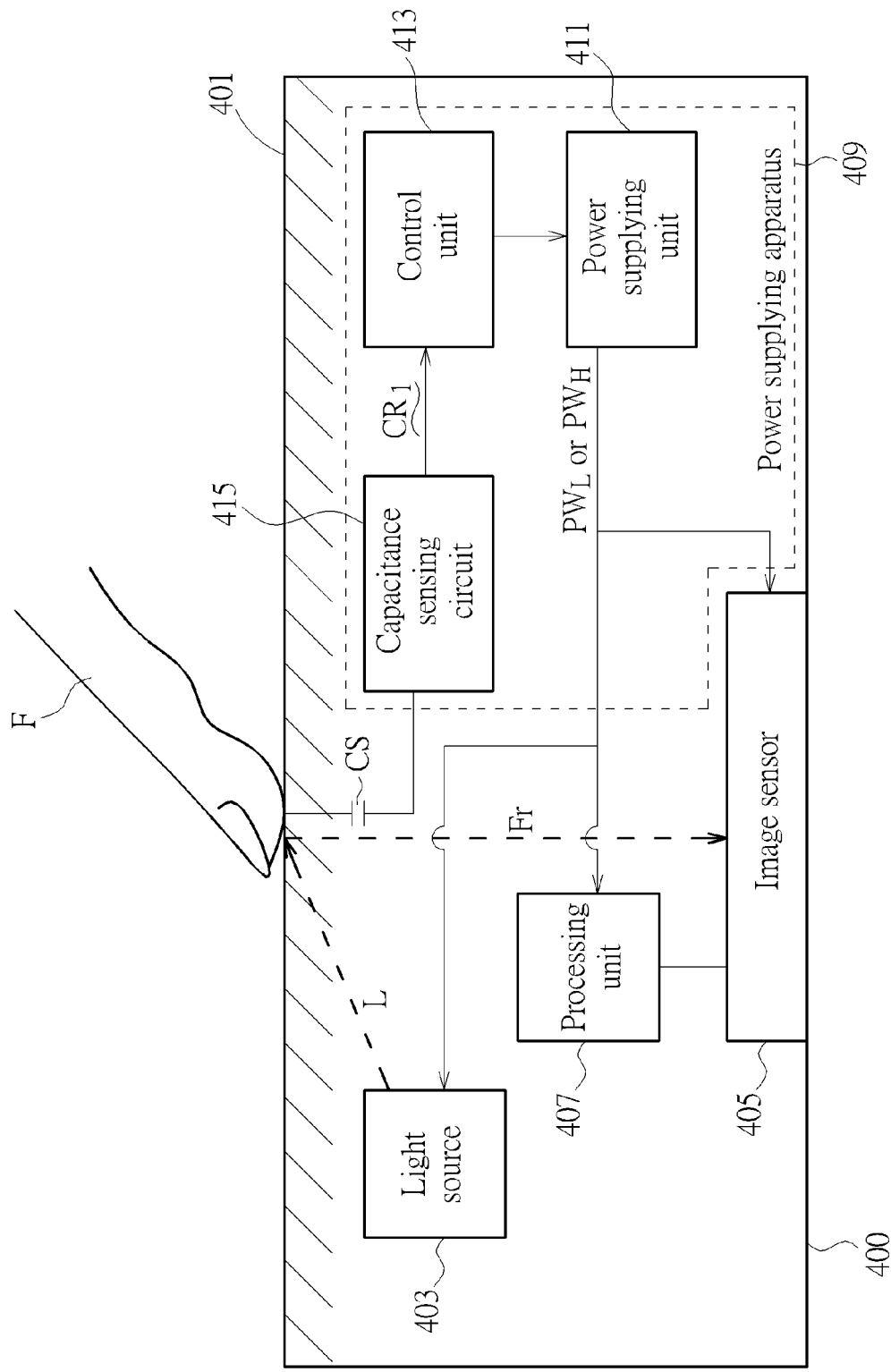
FIG. 4 is a schematic illustrating an optical touch control apparatus utilizing the power supplying apparatus according to one embodiment of the present invention.

FIG. 4 is a schematic illustrating an optical touch control apparatus utilizing the power supplying apparatus according to one embodiment of the present invention. As shown in FIG. 4, the optical touch control apparatus 400 comprises a sensing surface 401 (i.e. media layer in FIG. 3), a light source 403, an image sensor 405, a processing unit 407, and a power supplying apparatus 409 (ex. a battery). The light source 403 emits light L to an object such as a finger F on the sensing surface 401 to generate at least one object image Fr. The image sensor, senses the object image Fr. The processing unit 407 computes location information for the object according to the object image Fr sensed by the image sensor 405, such that a touch control operation can be performed on the sensing surface 401 via the object. The power supplying apparatus 409 comprises the power supplying unit 411, the control unit 413 and the capacitance sensing circuit 415. The capacitance sensing circuit 415 comprises the structure shown in FIG. 3 to detect if the capacitance value of the sensing capacitor $C_S$ changes to output the comparing result $CR_1$. Please note the capacitance sensing circuit according to the present invention is not limited to be applied to an optical touch control apparatus. The control unit 413 controls the power supplying unit 411 to operate in the high power mode to provide the power $PW_H$ to at least one of the sensing surface 401, the light source 403, the image sensor 405 and the processing unit 407 if the comparing result $CR_1$ indicates the object touches or approaches the sensing surface 401. On the contrary, the control unit 413 controls the power supplying unit 411 to operate in the low power mode to provide the power $PW_L$ to at least one of the sensing surface 401, the light source 403, the image sensor 405 and the processing unit 407 if the comparing result $CR_1$ indicates no object touches or approaches the sensing surface 401. Power $PW_H$ is larger than the power $PW_L$.

In view of above-mentioned embodiment, the variation for the capacitance value of the sensing capacitor can be accurately determined regarding the disturbance due to the capacitor leakage current. By this way, the touching or approaching for the object can be accurately computed to increase the efficiency for the power providing apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitance sensing circuit, comprising:
   a first voltage source;
   a first switch, wherein the first voltage source charges an sensing capacitor to a first voltage when the first switch is conductive;
   a base capacitor;
   a second voltage source;
   a second switch, wherein the second voltage source charges the base capacitor to a second voltage when the second switch is conductive;
   a first comparator, for outputting a first comparing result according a difference between a first voltage difference and a second voltage difference, wherein the first voltage difference is a difference for the first voltage and the second voltage, wherein the second voltage difference is a difference for an sensing voltage on the sensing capacitor and a base voltage on the base capacitor; and
   a voltage holding circuit, for keeping the base voltage at a reference voltage.

2. The capacitance sensing circuit of claim 1, further comprising:
   a conductive plate, coupled to the first voltage source and forms the sensing capacitor;
   a medium layer, covering the conductive plate;
   wherein the conductive plate and an object form the sensing capacitor when a distance between the object and the medium layer is smaller than a predetermined distance.

3. The capacitance sensing circuit of claim 2, wherein the object is a part of a human body.

4. The capacitance sensing circuit of claim 1, wherein the voltage holding circuit comprises a second comparator, for comparing the base voltage and the reference voltage to output a second comparing result to control the second switch, thereby the base voltage can be kept at the reference voltage.

5. A power supplying apparatus, comprising:
   a power supplying unit, for providing a first power in a low power mode, and for providing a second power higher than the first power in a high power mode;
   a control unit;
   a capacitance sensing circuit, comprising:
      a first voltage source;
      a first switch, wherein the first voltage source charges an sensing capacitor to a first voltage when the first switch is conductive;
      a base capacitor;
      a second voltage source;
      a second switch, wherein the second voltage source charges the base capacitor to a second voltage when the second switch is conductive, wherein the first switch and the second switch are controlled by a control signal to be conductive or non-conductive;
      a first comparator, for outputting a first comparing result according a difference between a first voltage difference and a second voltage difference, wherein the first voltage difference is a difference for the first voltage and the second voltage, wherein the second voltage difference is a difference for an sensing voltage on the sensing capacitor and a base voltage on the base capacitor; and
      a voltage holding circuit, for keeping the base voltage at a reference voltage;
   wherein the control unit controls the power supplying unit to operate in the high power mode if the difference between the first voltage difference and the second voltage difference is larger than a voltage threshold value;
   wherein the control unit controls the power supplying unit to operate in the low power mode if the difference between the first voltage difference and the second voltage difference is smaller than a voltage threshold value.

6. The power supplying apparatus of claim 5, further comprising:
   a conductive plate, coupled to the first voltage source and forms the sensing capacitor;
   a medium layer, covering the conductive plate;
   wherein the conductive plate and an object form the sensing capacitor when a distance between the object and the medium layer is smaller than a predetermined distance.

7. The power supplying apparatus of claim 6, wherein the object is a part of a human body.

8. The power supplying apparatus of claim 5, wherein the voltage holding circuit comprises a second comparator, for comparing the base voltage and the reference voltage to output a second comparing result to control the second switch, thereby the base voltage can be kept at the reference voltage.

9. An optical touch control apparatus, comprising:
   a sensing surface;
   a light source, for emitting light to an object on the sensing surface to generate at least one object image;
   an image sensor, for sensing the object image;
   a processing unit, for computing location information for the object according to the object image sensed by the image sensor;
   a power supplying apparatus, comprising:
      a power supplying unit, for providing a first power in a low power mode, and for providing a second power higher than the first power in a high power mode;
      a control unit;
      a capacitance sensing circuit, comprising:
         a first voltage source;
         a first switch, wherein the first voltage source charges an sensing capacitor to a first voltage when the first switch is conductive;
         a base capacitor;
         a second voltage source;
         a second switch, wherein the second voltage source charges the base capacitor to a second voltage when the second switch is conductive, wherein the first switch and the second switch are controlled by a control signal to be conductive or non-conductive;

a first comparator, for outputting a first comparing result according a difference between a first voltage difference and a second voltage difference, wherein the first voltage difference is a difference for the first voltage and the second voltage, wherein the second voltage difference is a difference for an sensing voltage on the sensing capacitor and a base voltage on the base capacitor; and a voltage holding circuit, for keeping the base voltage at a reference voltage;

wherein the control unit controls the power supplying unit to operate in the high power mode to provide the first power to at least one of the sensing surface, the light source, the image sensor and the processing unit if the difference between the first voltage difference and the second voltage difference is larger than a voltage threshold value;

wherein the control unit controls the power supplying unit to operate in the low power mode to provide the second power to at least one of the sensing surface, the light source, the image sensor and the processing unit if the difference between the first voltage difference and the second voltage difference is smaller than a voltage threshold value.

10. The optical touch control apparatus of claim 9, further comprising:

a conductive plate, coupled to the first voltage source and forms the sensing capacitor, wherein the sensing surface is provided above the conductive plate;

wherein the conductive plate and an object form the sensing capacitor when a distance between the object and the sensing surface is smaller than a predetermined distance.

11. The optical touch control apparatus of claim 10, wherein the object is a part of a human body.

12. The optical touch control apparatus of claim 9, wherein the voltage holding circuit comprises a second comparator, for comparing the base voltage and the reference voltage to output a second comparing result to control the second switch, thereby the base voltage can be kept at the reference voltage.

* * * * *